(12) United States Patent
Chuang et al.

(10) Patent No.: US 10,269,692 B1
(45) Date of Patent: Apr. 23, 2019

(54) PACKAGE STRUCTURE AND METHOD OF FORMING THE SAME

(71) Applicant: Nan Ya Printed Circuit Board Corporation, Taoyuan (TW)

(72) Inventors: Chin-Yi Chuang, Taoyuan (TW); Guo-Shau Luo, Taoyuan (TW); Shing-Fun Ho, Taoyuan (TW)

(73) Assignee: NAN YA PRINTED CIRCUIT BOARD CORPORATION, Taoyuan (TW)

(*) Notice: Subject to any disclaimer, the term of this patent is extended or adjusted under 35 U.S.C. 154(b) by 0 days.

(21) Appl. No.: 16/035,565

(22) Filed: Jul. 13, 2018

(30) Foreign Application Priority Data

Apr. 19, 2018 (TW) ............................. 107113334 A

(51) Int. Cl.
*H01L 23/49* (2006.01)
*H01L 23/498* (2006.01)
*H01L 21/48* (2006.01)

(52) U.S. Cl.
CPC ...... *H01L 23/49822* (2013.01); *H01L 21/481* (2013.01); *H01L 21/4857* (2013.01); *H01L 23/49838* (2013.01)

(58) Field of Classification Search
CPC ......... H01L 23/49822; H01L 23/49838; H01L 2/481; H01L 2/4857
See application file for complete search history.

(56) References Cited

U.S. PATENT DOCUMENTS

| 6,534,723 | B1* | 3/2003 | Asai | H01L 23/49811 174/255 |
| 8,598,698 | B1* | 12/2013 | Lim | H01L 23/36 175/255 |
| 9,966,345 | B1* | 5/2018 | Sizikov | H01L 23/62 |
| 9,999,129 | B2* | 6/2018 | Guzek | H05K 1/165 |

(Continued)

FOREIGN PATENT DOCUMENTS

| TW | 201351514 A | 12/2013 |
| TW | I538137 B | 6/2016 |
| TW | 201701443 A | 1/2017 |

OTHER PUBLICATIONS

Taiwan Patent Office, Office Action, Patent Application Serial No. 107113334, dated Oct. 12, 2018, Taiwan.

*Primary Examiner* — Hoa C Nguyen

(57) ABSTRACT

A package structure that includes a first redistribution structure and a second redistribution structure is provided. The first redistribution structure includes a first dielectric layer, and a first redistribution circuit in the first dielectric layer. The second redistribution structure includes a first portion on the first redistribution structure and a second portion on the first portion, and each of the portions is electrically connected to the first redistribution structure and the first portion, respectively. The circuit density of the second portion is lower than that of the first portion. The first portion includes a second dielectric layer having a second redistribution circuit therein. The second portion includes a third dielectric layer having a third redistribution circuit therein. The third dielectric layer has a stiffener layer, which is separated from the third redistribution circuit by the third dielectric layer. A method of forming a package structure is also provided.

15 Claims, 9 Drawing Sheets

(56) References Cited

U.S. PATENT DOCUMENTS

| | | | |
|---|---|---|---|
| 2004/0150097 A1* | 8/2004 | Gaynes | H01L 23/16 257/704 |
| 2009/0008765 A1* | 1/2009 | Yamano | H01L 24/83 257/690 |
| 2011/0169170 A1* | 7/2011 | Baba | H01L 23/49822 257/774 |
| 2011/0220404 A1* | 9/2011 | Yamasaki | H01L 21/486 174/261 |
| 2011/0254124 A1* | 10/2011 | Nalla | H01L 23/552 257/531 |
| 2012/0024582 A1* | 2/2012 | Maeda | H01L 21/4857 174/258 |
| 2017/0162556 A1* | 6/2017 | Lin | H01L 25/50 |
| 2017/0202083 A1* | 7/2017 | Baek | H01L 23/49534 |
| 2017/0287839 A1* | 10/2017 | Lee | H01L 23/13 |

* cited by examiner

PACKAGE STRUCTURE AND METHOD OF FORMING THE SAME

CROSS REFERENCE TO RELATED APPLICATIONS

This Application claims priority of Taiwan Patent Application No. 107113334, filed on Apr. 19, 2018, the entirety of which is incorporated by reference herein.

BACKGROUND

Technical Field

The present invention relates to a package structure and a method of forming the same.

Description of the Related Art

With the vigorous development of the electronic industry, electronic products have become increasingly multi-functional and high-performing. Engineers have developed different package types for semiconductor package structures. In order to meet the packaging requirements on semiconductor packages, such as that they be highly integrated and miniaturized, the package substrate has also evolved from a double-layer circuit board to a multi-layer circuit board, so that the available wiring area on the package substrate can be expanded by using the interlayer connection technology in a limited space. As such, the requirements on the integrated circuit with a high circuit density can be met, and the thickness of the package substrate can be reduced, thereby achieving the purpose of miniaturizing the package structure and improving electrical functionality.

In the prior art, the completed redistribution structures are laminated by using the conventional drilled sequential lamination. Since the method needs to combine the redistribution structures through the interlayers, the overall thickness cannot be reduced and the manufacturing cost is high. Furthermore, for the purposes of miniaturization and densification, a coreless package substrate has been developed. However, the coreless package substrate is becoming thinner, which cannot provide sufficient supportability and flatness. In particular, when the solder balls are planted at a high temperature, the heat can warp the thinned substrate, which can have an adverse effect on the subsequent package process.

Therefore, a novel package structure and a method of forming the package structure are required. As such, miniaturization and densification of the package structure can be achieved, and the supportability of the coreless package substrate can be enhanced to reduce the warpage of the substrate, thereby improving the quality of the back-end package process.

BRIEF SUMMARY

According to some embodiments of the present invention, a package structure that includes a first redistribution structure and a second redistribution structure is provided. The first redistribution structure includes a first dielectric layer, and a first redistribution circuit is disposed in the first dielectric layer. The second redistribution structure includes a first portion and a second portion. The first portion is disposed on the first redistribution structure and electrically connected to the first redistribution structure. The second portion is disposed on the first portion and electrically connected to the first portion. The circuit density of the second portion is lower than that of the first portion. The first portion includes a second dielectric layer, and a second redistribution circuit is disposed in the second dielectric layer. The second portion includes a third dielectric layer. A third redistribution circuit is disposed in the third dielectric layer. A stiffener layer is disposed in the third dielectric layer. The stiffener layer is separated from the third redistribution circuit by the third dielectric layer.

According to some embodiments of the present invention, a package structure that includes a first redistribution structure and a second redistribution structure is provided. The first redistribution structure includes a first dielectric layer, and a first redistribution circuit is disposed in the first dielectric layer. The second redistribution structure includes a first portion, a second portion and a third portion. The first portion is disposed on the first redistribution structure and electrically connected to the first redistribution structure. The second portion is disposed on the first portion and electrically connected to the first portion. The third portion is disposed on a sidewall of the first redistribution structure. The circuit density of the second portion is lower than the circuit density of the first portion. The first portion includes a second dielectric layer, and a second redistribution circuit disposed in the second dielectric layer. The second portion includes a third dielectric layer, a third redistribution circuit disposed in the third dielectric layer, and a stiffener layer disposed in the third dielectric layer. The stiffener layer is separated from the third redistribution circuit by the third dielectric layer.

According to some embodiments of the present invention, a method of forming a package structure that includes a first redistribution structure and a second redistribution structure is provided. Forming the first redistribution structure includes forming a first dielectric layer, and forming a first redistribution circuit in the first dielectric layer. Forming a first portion of the second redistribution structure on the first redistribution structure includes forming a second dielectric layer, and forming a second redistribution circuit in the second dielectric layer. Forming a second portion of the second redistribution structure on the first portion includes forming a third dielectric layer, forming a third redistribution circuit in the third dielectric layer; and forming a stiffener layer in the third dielectric layer. The circuit density of the second portion is lower than the circuit density of the first portion. The stiffener layer is separated from the third redistribution circuit by the third dielectric layer.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
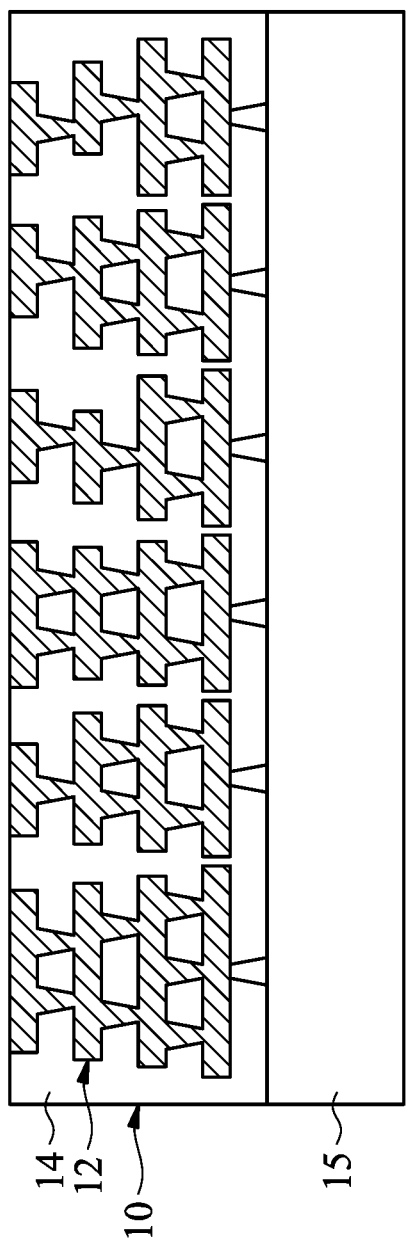
FIGS. 1A-1H illustrate cross-sectional views of a package structure at different process stages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present invention provide a package structure and a method of forming the package structure. In the embodiments of the present invention, the redistribution structure may be combined with each other directly by a build-up method, and a stiffener layer is disposed in a region having a relatively low density of the redistribution structure. As such, the package structure can be miniaturized and densified, and the supportability and flatness of the coreless substrate can be enhanced, thereby improving the quality of the back-end package process.

FIGS. 1A-1H illustrate cross-sectional views of a package structure 100 at different process stages in accordance with some embodiments.

Figure 1B:
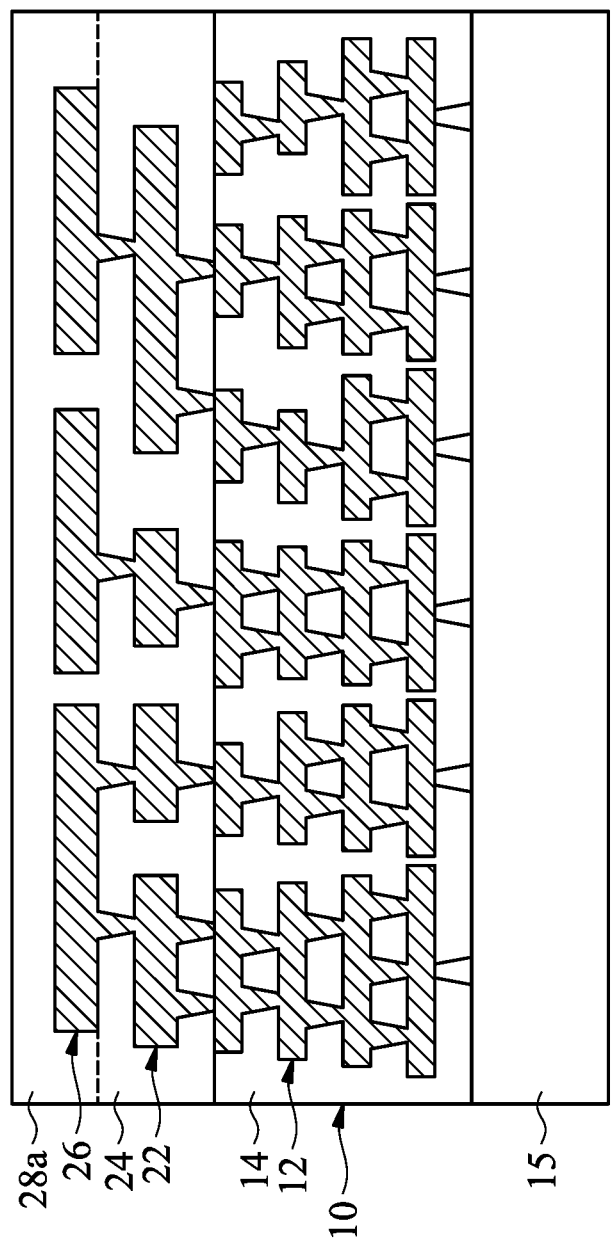
Figure 1C:
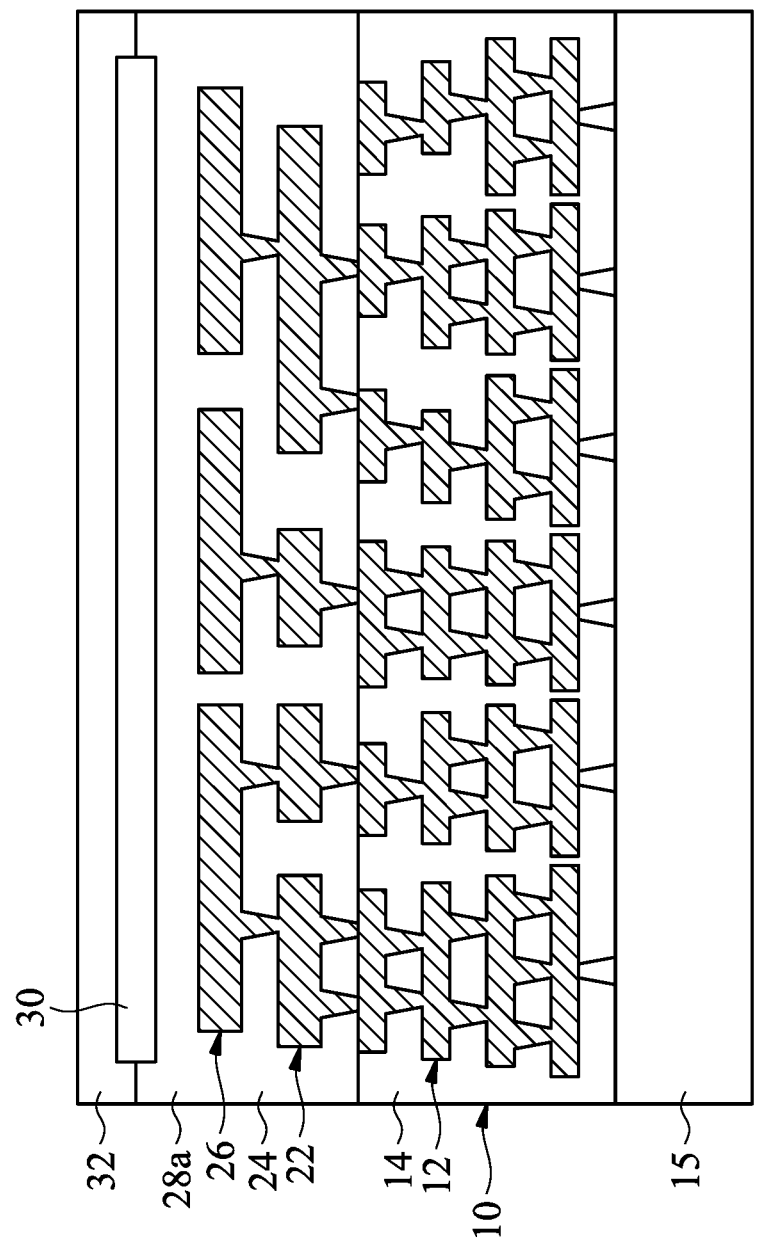
Figure 1D:
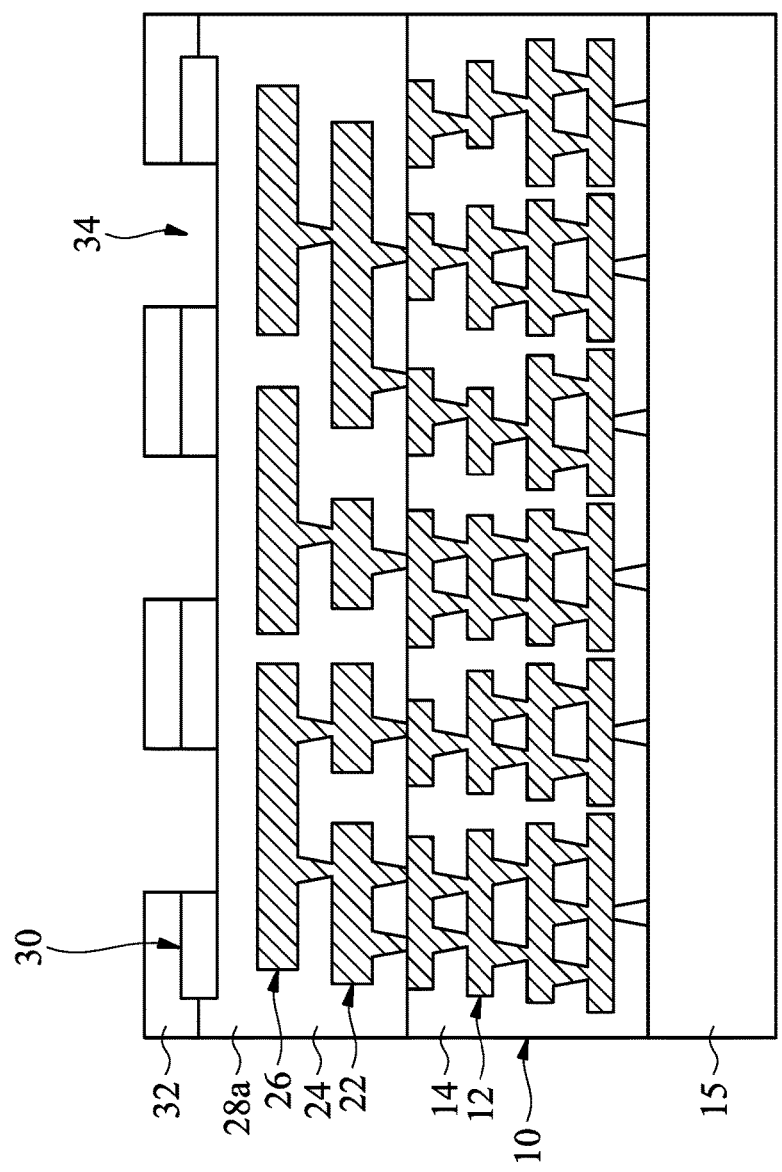
Figure 1E:
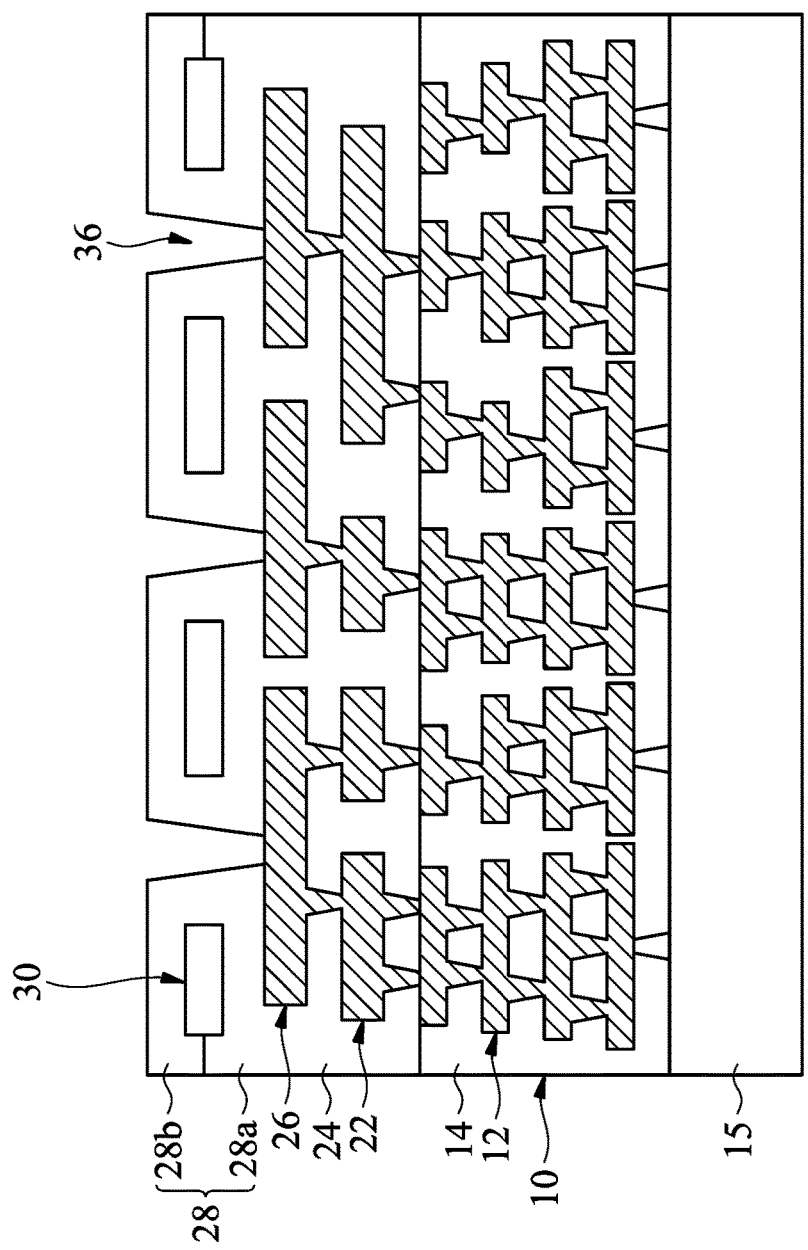
Figure 1F:
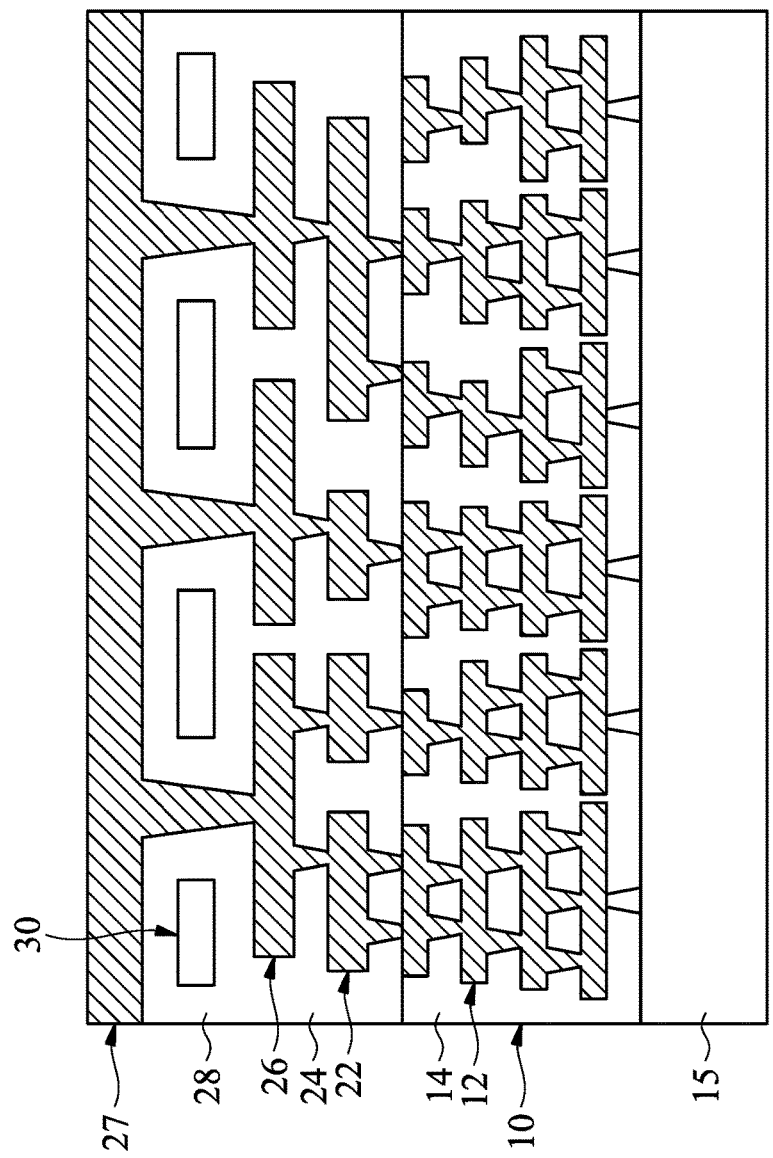
Figure 1G:
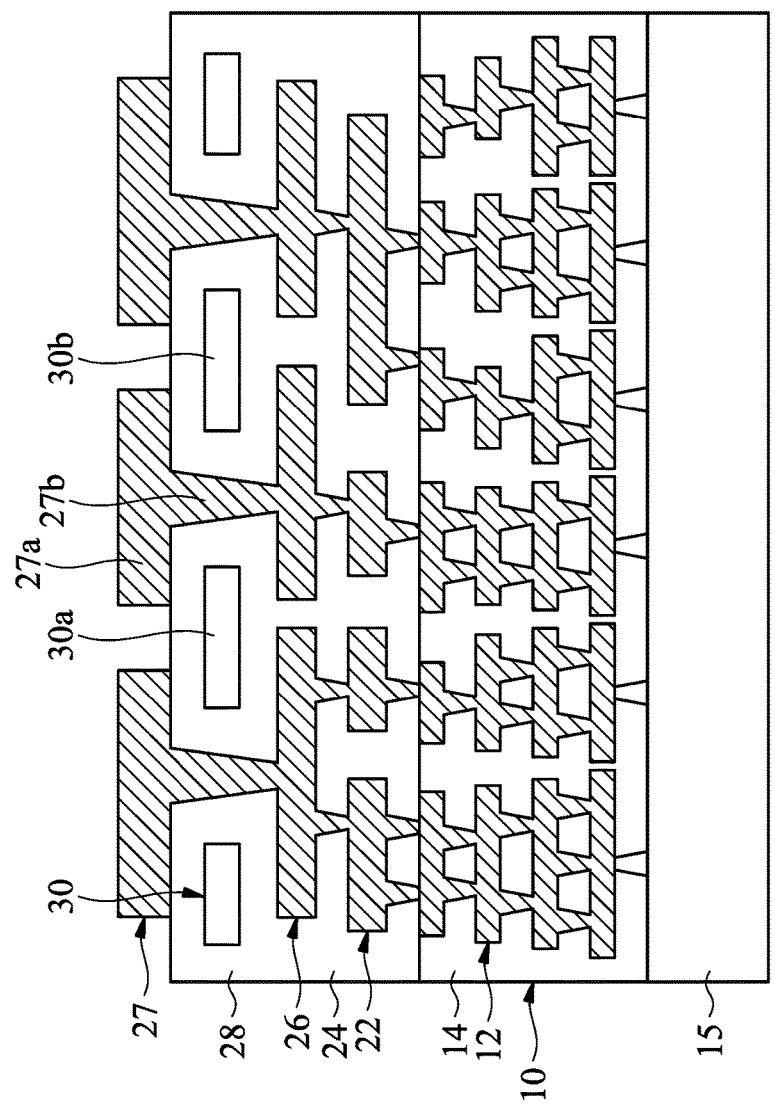
Figure 1H:
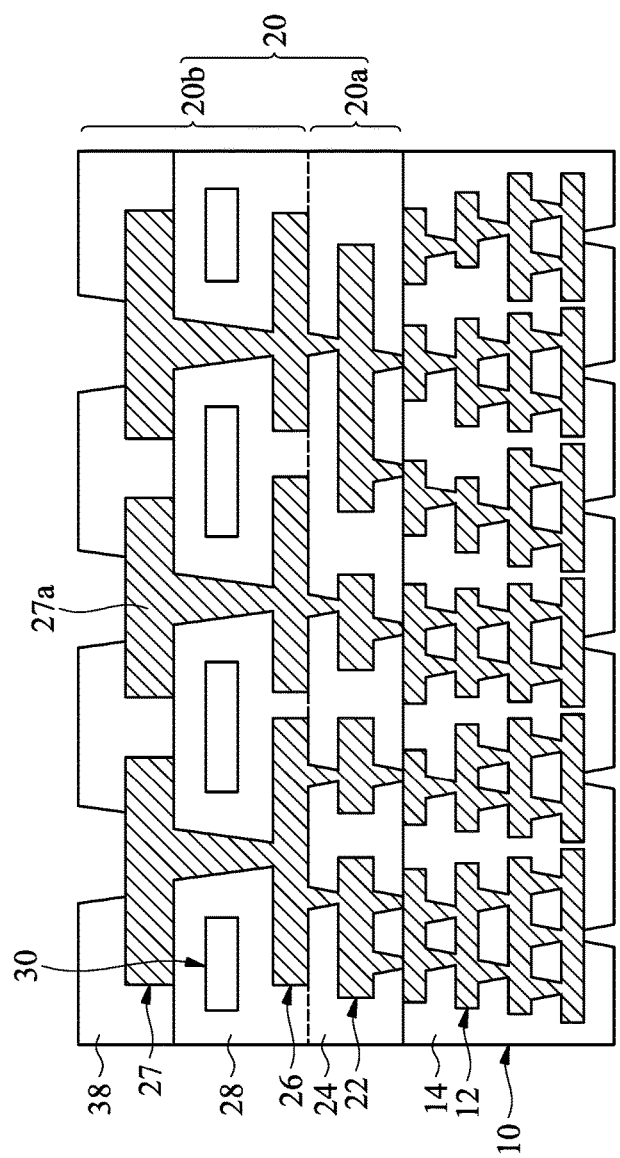

Referring to FIG. 1H, the package structure 100 includes a first redistribution structure 10 and a second redistribution structure 20. The first redistribution structure 10 includes a redistribution circuit 12 and a dielectric layer 14. The second redistribution structure 20 includes a first portion 20a and a second portion 20b. The first portion 20a includes a redistribution circuit 22 and a dielectric layer 24. The second portion 20b includes a redistribution circuit 26, a redistribution circuit 27, a dielectric layer 28, a stiffener layer 30, and a solder mask layer 38. The steps of forming the package structure 100 will be described in detail below.

First, referring to FIG. 1A, the first redistribution structure 10 is provided and disposed on a carrier 15. The first redistribution structure 10 includes the dielectric layer 14 and the redistribution circuit 12 disposed in the dielectric layer 14. In some embodiments, the first redistribution structure 10 may be a coreless substrate. The redistribution circuit 12 may be a single layer or multiple layers, and the material of the redistribution circuit 12 may include nickel, gold, tin, lead, copper, aluminum, silver, chromium, tungsten, a combination thereof, or an alloy thereof. The method of forming the redistribution circuit 12 may include an image transfer process, a laser process, a deposition process, an electroplating process, a lamination process, a coating process, or a combination thereof. In some embodiments, the material of the dielectric layer 14 may include epoxy resin, bismaleimide triazine (BT), polyimide (PI), build-up insulation film, poly(phenylene oxide) (PPO), polypropylene (PP), poly(methyl methacrylate) (PMMA), polytetrafluoroethylene (PTFE), a combinations thereof, or other suitable insulation materials. The method of forming the dielectric layer 14 may include a lamination process, a coating process, or a combination thereof.

Referring to FIG. 1B, the dielectric layer 24 is formed on the first redistribution structure 10, and the redistribution circuit 22 is formed in the dielectric layer 24. The redistribution circuit 22 is electrically connected to the redistribution circuit 12. Next, a dielectric layer 28a is formed on the dielectric layer 24, and the redistribution circuit 26 is formed in the dielectric layer 28a. The redistribution circuit 26 is electrically connected to the redistribution circuit 22. In some embodiments, the redistribution circuits 22 and 26 may be a single layer or multiple layers, and the material of the redistribution circuits 22 and 26 may include nickel, gold, tin, lead, copper, aluminum, silver, chromium, tungsten, a combination thereof, or an alloy thereof. The method of forming the redistribution circuits 22 and 26 may include an image transfer process, a laser process, a deposition process, an electroplating process, a lamination process, a coating process, or a combination thereof. In some embodiments, the material of the dielectric layers 24 and 28a may include epoxy resin, bismaleimide triazine (BT), polyimide (PI), build-up insulation film, poly(phenylene oxide) (PPO), polypropylene (PP), poly(methyl methacrylate) (PMMA), polytetrafluoroethylene (PTFE), a combinations thereof, or other suitable insulation materials. The method of forming the dielectric layers 24 and 28a may include a lamination process, a coating process, or a combination thereof.

Next, referring to FIG. 1C, the stiffener layer 30 is disposed on the dielectric layer 28a, and a dry film 32 is disposed on the stiffener layer 30. In some embodiments, the stiffener layer 30 may be disposed on the dielectric layer 28a by a lamination process. In some embodiments, the stiffener layer 30 may be a material with high rigidity. For example, the material of the stiffener layer 30 may include a metal (e.g., copper or aluminum), a metal alloy (e.g., stainless steel), a ceramic substrate, an organic substrate, or a combination thereof.

Referring to FIG. 1D, portions of the dry film 32 and the stiffener layer 30 are removed to form an opening 34. In some embodiments, the method of removing portions of the dry film 32, the stiffener layer 30 and the dielectric layer 28a may include an exposure process, a development process, an etching process, or a combination thereof.

Referring to FIG. 1E, the dry film 32 is removed, and a dielectric layer 28b is formed on the stiffener layer 30 and the dielectric layer 28a. Then, portions of the dielectric layers 28a and the dielectric layer 28b are removed to form an opening 36 and expose portions of the redistribution circuit 26. In some embodiments, the dry film 32 may be removed by a stripping process. In some embodiments, the method of forming the dielectric layer 28b may include a lamination process, a coating process, or a combination thereof, and the material of the dielectric layer 28b may be the same as that of the dielectric layer 28a, which will not be described herein. In some embodiments, the method for removing portions of the dielectric layer 28a and the dielectric layer 28b may include an exposure process, a development process, an etching process, or a combination thereof.

Referring to FIG. 1F, the redistribution circuit 27 is formed on the dielectric layer 28 and in the opening 36 so that the redistribution circuit 27 is electrically connected to the redistribution circuit 26. Next, referring to FIG. 1G, portions of the redistribution circuit 27 is removed to form a plurality of pads (e.g., a pad 27a). In some embodiments, the method of removing portions of the redistribution circuit 27 may include an exposure process, a development process, an etching process, or a combination thereof. In some embodiments, the redistribution circuit 27 may be a single layer or multiple layers, and the material and the formation method of the redistribution circuit 27 may be the same as those of the redistribution circuit 26, which will not be described herein.

As shown in FIG. 1G, the stiffener layer 30 is embedded in the dielectric layer 28, and the stiffener layer 30 is separated from the redistribution circuits 26 and 27 by the dielectric layer 28. In other words, there is no electrical connection between the stiffener layer 30 and the redistribution circuits 26 and 27. The stiffener layer 30 has a plurality of stiffeners such as a stiffener 30a and a stiffener 30b. The redistribution circuit 27 has a plurality of pads and a plurality of vias, such as a pad 27a and a via 27b. In some embodiments, the via 27b is located between the stiffener 30a and the stiffener 30b, and the via 27b has a tapered width.

Referring to FIG. 1H, a solder mask layer 38 is disposed on the redistribution circuit 27, and portions of the pad 27a are exposed by the solder mask layer 38. Then, the carrier 15 is removed, thereby completing the package structure 100 including the first redistribution structure 10 and the second redistribution structure. In some embodiments, a sidewall of the first redistribution structure 10 is level with a sidewall of the second redistribution structure 20. In some embodiments, the solder mask layer 38 may be a photosensitive material, a thermal sensitive material, or a combination thereof. For example, the solder mask layer 38 may be a solder resist, such as an ultraviolet solder resist or a thermal curing solder resist. The method of forming the solder mask layer 38 may be a coating process or a dry film lamination process, and portions of the pad 27a may be exposed by an exposure process and a development process.

It should be noted that the second redistribution structure 20 is directly formed on the first redistribution structure 10 layer by layer by a build-up method, and the redistribution structures can be combined with each other in high density without the interlayers. Therefore, the overall thickness of the structure can be effectively reduced, the process steps can be simplified, and the production cost can be reduced.

Furthermore, the first redistribution structure 10 is constructed with a relatively fine circuit and high density technology, for example, according to the design criteria of the integrated circuit. The second redistribution structure 20 is constructed with a relatively wide circuit and low density technology, for example, according to the design criteria of the printed circuit board. In other words, the circuit density of the first redistribution structure 10 is higher than the circuit density of the second redistribution structure 20.

Specifically, as shown in FIG. 1H, the portion of the redistribution circuit 12 exposed at the bottom of the first redistribution wiring structure 10 is used to electrically connect with the semiconductor chips in the subsequent step. Thus, in the first redistribution structure 10, the region closer to the bottom has the higher circuit density, whereas the region closer to the second redistribution structure 20 has the lower circuit density. In addition, the portion of the pad 27a exposed at the top of the second redistribution structure 20 is used to electrically connect with the solder balls in the subsequent step. Thus, in the second redistribution structure 20, the region closer to the top (i.e., the second portion 20b) has the lower circuit density, whereas the region closer to the first redistribution structure 10 (i.e., the first portion 20a) has the higher circuit density. In other words, in the second redistribution structure 20, the circuit density of the second portion 20b is lower than the circuit density of the first portion 20a.

Moreover, as shown in FIG. 1H, the second redistribution structure 20 is a coreless substrate, and the stiffener layer 30 is disposed in the second portion 20b having a relatively low density of the second redistribution structure 20. It is noted that since the stiffener layer 30 has the strong rigidity, the supportability of the coreless substrate can be improved and the warpage of the substrate can be reduced, thereby improving the quality of the back-end package process.

Figure 2:
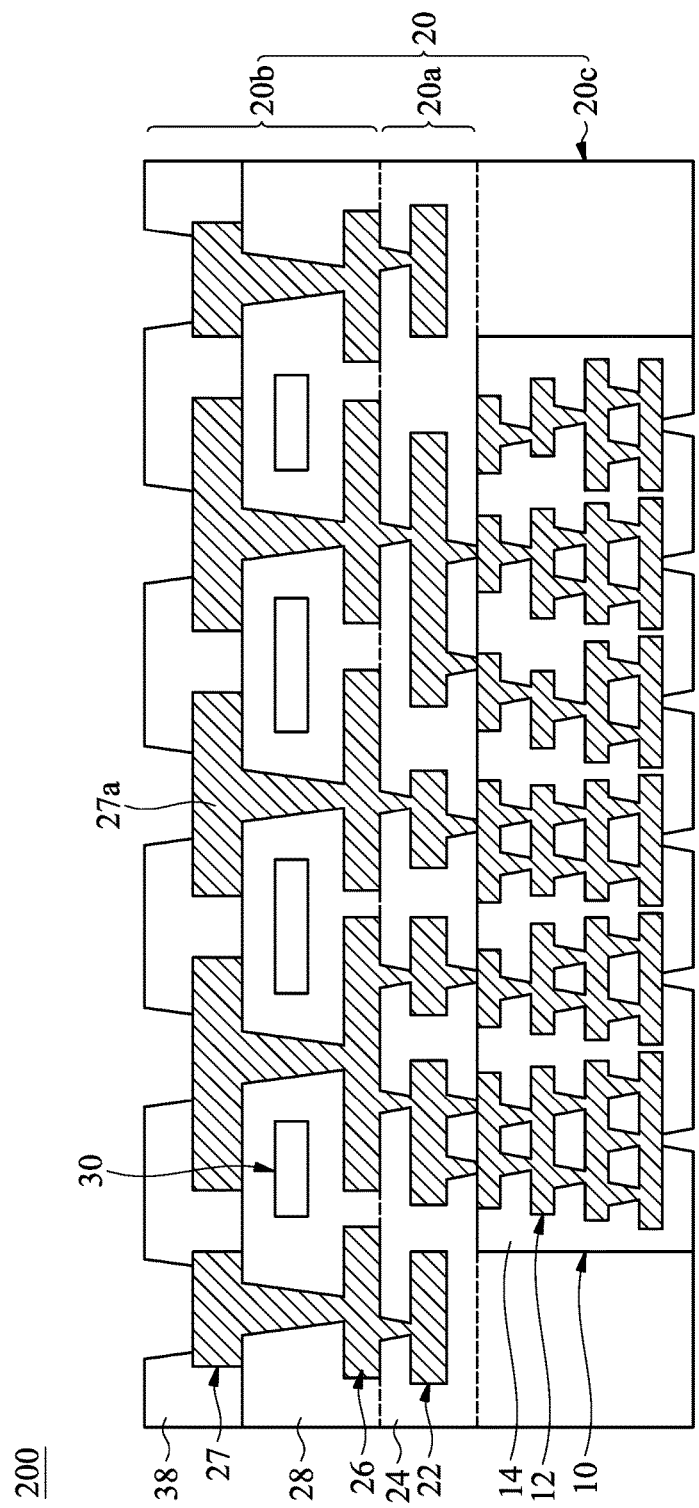
FIG. 2 illustrates a cross-sectional view of a package structure in accordance with other embodiments.

FIG. 2 illustrates a cross-sectional view of a package structure 200 in accordance with other embodiments. Referring to FIG. 2, the package structure 200 is substantially similar to the package structure 100 of the above embodiment. The difference between the package structure 200 and the package structure 100 is that in the package structure 200, the second redistribution structure 20 further includes a third portion 20c on the sidewall of the first redistribution structure 10 in addition to the first portion 20a and the second portion 20b.

Specifically, as shown in FIG. 2, after the first redistribution structure 10 is formed, the third portion 20c of the redistribution structure 20 is formed on the sidewall of the first redistribution structure 10, and the third portion 20c is free of conductive structures. In some embodiments, the third portion 20c is formed of a dielectric material, and the material and the formation method of the third portion 20c may be the same as those of the aforementioned dielectric layers 24 and 28, which will not be described herein.

Next, as the methods described in FIGS. 1B to 1H, the first portion 20a and the second portion 20b of the second redistribution structure 20 are sequentially formed on the first redistribution structure 10 and the third portion 20c. As shown in FIG. 2, the second redistribution structure 20 covers a top surface and at least two sidewalls of the first redistribution structure 10. In the second redistribution structure 20, the sidewalls of the third portion 20c are level with the sidewalls of the first portion 20a and the second portion 20b.

In summary, the embodiments of the present invention provide a package structure and a method of forming the package structure. In the embodiments of the present invention, the redistribution structure may be combined with each other directly by a build-up method, and a stiffener layer is disposed in a region having a relatively low density of the redistribution structure. As such, the package structure can be miniaturized and densified, and the supportability and flatness of the coreless substrate can be enhanced, thereby improving the quality of the back-end package process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first redistribution structure comprising:
      a first dielectric layer, and a first redistribution circuit disposed in the first dielectric layer;
a second redistribution structure comprising a first portion and a second portion, wherein the first portion is disposed on the first redistribution structure and electrically connected to the first redistribution structure, and the second portion is disposed on the first portion and electrically connected to the first portion; wherein a circuit density of the second portion is lower than a circuit density of the first portion;
wherein the first portion comprises:
a second dielectric layer, and
a second redistribution circuit disposed in the second dielectric layer;
the second portion comprises:
a third dielectric layer,
a third redistribution circuit disposed in the third dielectric layer, and
a stiffener layer disposed in the third dielectric layer, wherein the stiffener layer is separated from the third redistribution circuit by the third dielectric layer.

2. The package structure as claimed in claim 1, wherein a material of the stiffener layer comprises a metal, a metal alloy, a ceramic substrate, an organic substrate, or a combination thereof.

3. The package structure as claimed in claim 1, wherein a circuit density of the first redistribution structure is higher than a circuit density of the second redistribution structure.

4. The package structure as claimed in claim 1, wherein a sidewall of the first redistribution structure is level with a sidewall of the second redistribution structure.

5. The package structure as claimed in claim 1, wherein in the first redistribution structure, the region closer to the second redistribution structure has the lower circuit density.

6. The package structure as claimed in claim 1, wherein there is no electrical connection between the stiffener layer and the third redistribution circuit.

7. The package structure as claimed in claim 1, wherein the stiffener layer comprises a first stiffener and a second stiffener, and the third redistribution circuit has a via between the first stiffener and the second stiffener, wherein the via has a tapered width.

8. A package structure, comprising:
a first redistribution structure comprising:
a first dielectric layer, and
a first redistribution circuit disposed in the first dielectric layer;
a second redistribution structure comprising a first portion, a second portion and a third portion, wherein the first portion is disposed on the first redistribution structure and electrically connected to the first redistribution structure; the second portion is disposed on the first portion and electrically connected to the first portion; and the third portion is disposed on a sidewall of the first redistribution structure; wherein a circuit density of the second portion is lower than a circuit density of the first portion;
wherein the first portion comprises:
a second dielectric layer, and
a second redistribution circuit disposed in the second dielectric layer;
the second portion comprises:
a third dielectric layer,
a third redistribution circuit disposed in the third dielectric layer, and
a stiffener layer disposed in the third dielectric layer, wherein the stiffener layer is separated from the third redistribution circuit by the third dielectric layer.

9. The package structure as claimed in claim 8, wherein the third portion of the second redistribution structure is free of conductive structures.

10. The package structure as claimed in claim 8, wherein the second redistribution structure covers a top surface and at least two sidewalls of the first redistribution structure.

11. The package structure as claimed in claim 8, wherein in the second redistribution structure, a sidewall of the third portion is level with sidewalls of the first portion and the second portion.

12. A method of forming a package structure, comprising:
forming a first redistribution structure comprising:
forming a first dielectric layer, and
forming a first redistribution circuit in the first dielectric layer;
forming a first portion of a second redistribution structure on the first redistribution structure, comprising:
forming a second dielectric layer, and
forming a second redistribution circuit in the second dielectric layer;
forming a second portion of the second redistribution structure on the first portion, wherein a circuit density of the second portion is lower than a circuit density of the first portion, comprising:
forming a third dielectric layer,
forming a third redistribution circuit in the third dielectric layer; and
forming a stiffener layer in the third dielectric layer, wherein the stiffener layer is separated from the third redistribution circuit by the third dielectric layer.

13. The method of forming a package structure as claimed in claim 12, wherein the stiffener layer is formed in the third dielectric layer by a lamination process.

14. The method of forming a package structure as claimed in claim 12, further comprising: forming a third portion of the second redistribution structure on a sidewall of the first redistribution structure.

15. The method of forming a package structure as claimed in claim 14, wherein after forming the first redistribution structure, the third portion, the first portion and the second portion of the second redistribution structure are sequentially formed.

* * * * *